United States Patent [19]
Shichi et al.

[11] Patent Number: 6,058,597
[45] Date of Patent: May 9, 2000

[54] ELECTRONIC DEVICE MOUNTING APPARATUS

[75] Inventors: Takahisa Shichi, Oogaki; Hirokazu Usui, Nagoya, both of Japan

[73] Assignee: Nippondenso Co., Ltd., Kariya, Japan

[21] Appl. No.: 08/693,961

[22] Filed: Aug. 7, 1996

[30] Foreign Application Priority Data

Aug. 12, 1995 [JP] Japan ................................... 7-227175

[51] Int. Cl.⁷ .................................................. H05K 3/30
[52] U.S. Cl. ............................... 29/706; 29/714; 29/740; 29/741; 221/3; 221/4
[58] Field of Search .......................... 29/407.01, 407.04, 29/407.09, 407.1, 706, 708, 709, 714, 740, 741, 809, 707; 221/2, 3, 4, 5, 21; 434/335, 336, 337, 338

[56] References Cited

U.S. PATENT DOCUMENTS

| | | | |
|---|---|---|---|
| 2,672,289 | 3/1954 | Skillman | 221/5 X |
| 4,811,764 | 3/1989 | McLaughlin | 221/4 X |
| 4,934,891 | 6/1990 | Hawkswell | 235/385 X |
| 5,026,288 | 6/1991 | Castiglia et al. | 434/169 |
| 5,036,582 | 8/1991 | Usui | 29/714 X |
| 5,336,935 | 8/1994 | Shitanda et al. | 29/407.04 X |
| 5,553,376 | 9/1996 | Solanki et al. | 29/709 X |

FOREIGN PATENT DOCUMENTS

| | | | |
|---|---|---|---|
| 1-257536 | 10/1989 | Japan | . |
| 3-124100 | 5/1991 | Japan | . |
| 3-149145 | 6/1991 | Japan | . |
| 5-021993 | 1/1993 | Japan | . |
| 5-021995 | 1/1993 | Japan | . |
| 5-008987 | 2/1993 | Japan | . |
| 6-232591 | 8/1994 | Japan | . |
| 6-283891 | 10/1994 | Japan | 29/709 |

*Primary Examiner*—Joseph M. Gorski
*Attorney, Agent, or Firm*—Pillsbury Madison & Sutro LLP

[57] ABSTRACT

An electronic device mounting apparatus prevents an error at the setup time prior to startup of the apparatus and enables mounting of proper electronic devices without a mistake. A cartridge and a lane of a cartridge mounting rack have a cartridge side connector (upper electrode portion, connection plug, lower electrode portion) and a lane side connector (fixed plug) which are electrically connected when the cartridge is installed on the lane. An error detecting circuit is formed by employing these connectors as part thereof. The error detecting circuit determines whether or not the installation position of the cartridge is appropriate depending on the conductive state or non-conductive state from a power supply to a warning buzzer when the connectors are connected.

4 Claims, 9 Drawing Sheets

ELECTRONIC DEVICE MOUNTING APPARATUS

CROSS-REFERENCE TO RELATED APPLICATION

The present application is related to and claims priority from Japanese Patent Application No. Hei 7-227125, incorporated herein by reference.

BACKGROUND OF THE INVENTION

1. Field of the Invention

The present invention relates to an electronic device mounting apparatus wherein a plurality of device supplying cartridges are disposed at each predetermined position of a cartridge mounting rack and electronic devices supplied from the device supplying cartridges are automatically continuously mounted.

2. Description of Related Art

In the conventional electronic device mounting apparatus of this type according to currently realized technology, a plurality of device supplying cartridges are disposed at each predetermined position of the cartridge mounting rack and electronic devices (surface mount devices) supplied from each device supplying cartridge are automatically continuously mounted. Concretely speaking, in the electronic device mounting apparatus, the cartridge mounting rack is divided into a plurality of lanes. At the setup time prior to startup of the apparatus, a specific device supplying cartridge is installed corresponding to each lane number. When the apparatus is operated, an electronic device is received from a specific device supplying cartridge according to the instruction of a controller. Then, that electronic device is mounted at a predetermined position on a substrate. Generally, necessary electronic devices specified by the controller are controlled according to lane numbers allocated to the cartridge mounting rack. For example, if an electronic device for the lane No. 50 is specified by the controller, the electronic device for the lane No. 50 is received and mounted on the substrate.

However, in the above mentioned electronic device mounting apparatus, if the device supplying cartridge is installed on a cartridge mounting rack different from a previously set lane number at the setup time prior to startup of the apparatus, incorrect electronic devices are mounted on the substrate. Currently, as a measure for preventing such an error at the setup time, indication of the number of the device supplying cartridge, visual confirmation by an operator, and confirmation by a work instruction sheet are conducted. However, since this method contains a problem in terms of its reliability and work efficiency, development of technology capable of preventing the error at the setup time securely has been demanded.

SUMMARY OF THE INVENTION

Therefore, the present invention has been proposed to solve the above problem and it is an object thereof to provide an electronic device mounting apparatus for preventing an error in mounting the device supplying cartridge at the setup time prior to startup of the apparatus and further for enabling mounting of proper devices.

Other objects and features of the invention will appear in the course of the description thereof, which follows.

BRIEF DESCRIPTION OF THE DRAWINGS

Additional objects and advantages of the present invention will be more readily apparent from the following detailed description of preferred embodiments thereof when taken together with the accompanying drawings in which.

DETAILED DESCRIPTION OF THE PRESENTLY PREFERRED EXEMPLARY EMBODIMENTS

Hereinafter, the present invention will be described in detail with respect to the preferred embodiments in conjunction with attached drawings. An electronic device mounting apparatus according to this embodiment is an apparatus for automatically mounting chip shaped devices (electronic devices) continuously on substrates. Individual devices are supplied from a device supplying cartridge (common use cartridge). A plurality of the same cartridges are prepared so that they are commonly usable. The cartridges are installed respectively on each predetermined lane (setting area) of a cartridge mounting rack (cartridge mounting station). Based on the lane number specified by the controller, specified devices are mounted at a predetermined position on the substrate.

Figure 8:
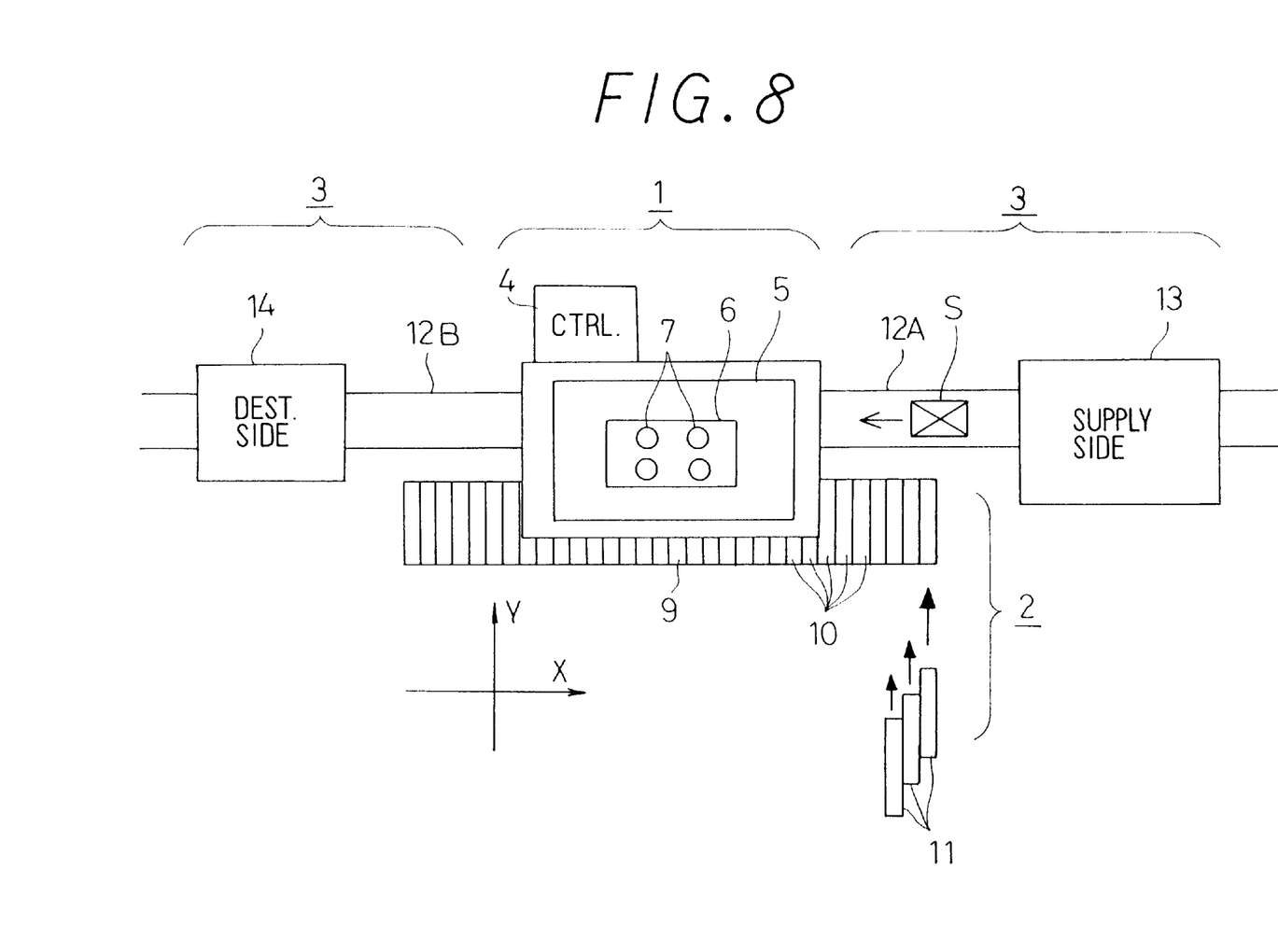
FIG. 8 is a plan view showing the overall construction of the electronic device mounting apparatus.

FIG. 8 is a plan view showing schematically the overall construction of the electronic device mounting apparatus of the present embodiment. This apparatus includes a main unit 1 for receiving/sending devices and mounting the devices on a substrate S, a device supplying section 2 for supplying devices to the main unit 1, and a substrate transporting section 3 for transporting the substrate S before and after (right and left as viewed in the Figure) the main unit 1. Hereinafter, the respective sections will be described in detail.

Figure 9:
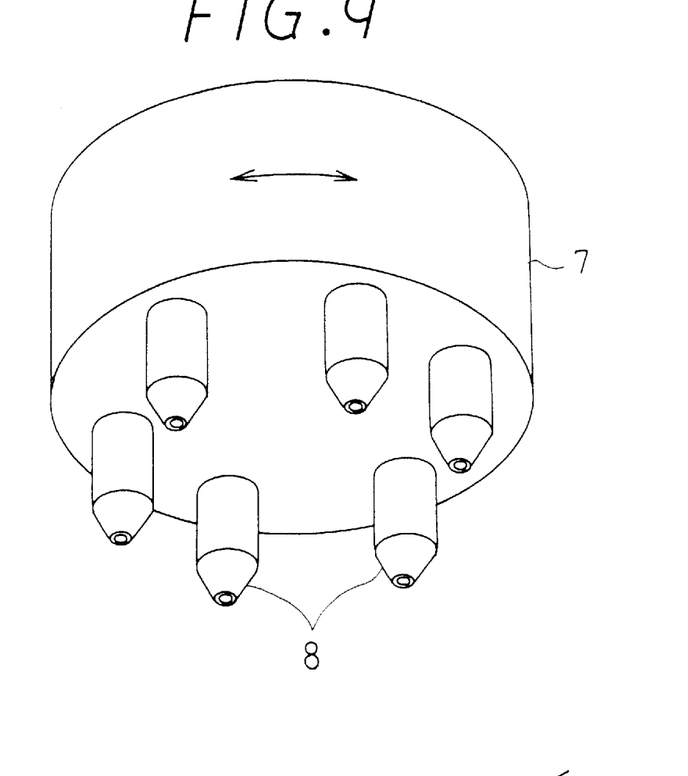
FIG. 9 is a perspective view showing the mounting head.

In the main unit 1, a mounting stage 6 capable of moving freely in the X and Y directions is installed on a table 5. The stage 6 contains a plurality of mounting heads 7 for receiving a device from the device supplying section 2 and mounting the device at a predetermined position on the substrate S. The mounting heads 7 are rotatably supported around shafts (not shown) and contain a plurality of suction nozzles 8 for holding the devices as shown in FIG. 9. A controller 4 drives the mounting stage 6, the mounting heads 7, and the like according to predetermined control programs and includes a central processing unit having various memories (ROM, RAM, etc.).

Referring to FIG. 8, the device supplying section 2 has a cartridge mounting rack 9 extending in the left-to-right direction as shown in FIG. 8. The cartridge mounting rack 9 has a plurality of lanes 10 (setting areas) partitioned in parallel. Each lanes 10 has a lane number (serial numbers from 1 in this embodiment) and a device supplying cartridge (hereinafter simply referred to as a cartridge) corresponding to the lane number is installed on each lane 10.

On the other hand, the substrate transporting section 3 has conveyors 12A and 12B extending in the left-to-right direction as viewed in the Figure, with a loading side driving portion 13 and an unloading side driving portion 14 for driving the conveyors 12A and 12B respectively. The substrate S moves from the right to the left as viewed in FIG. 9 on the conveyors 12A and 12B.

Figure 1:
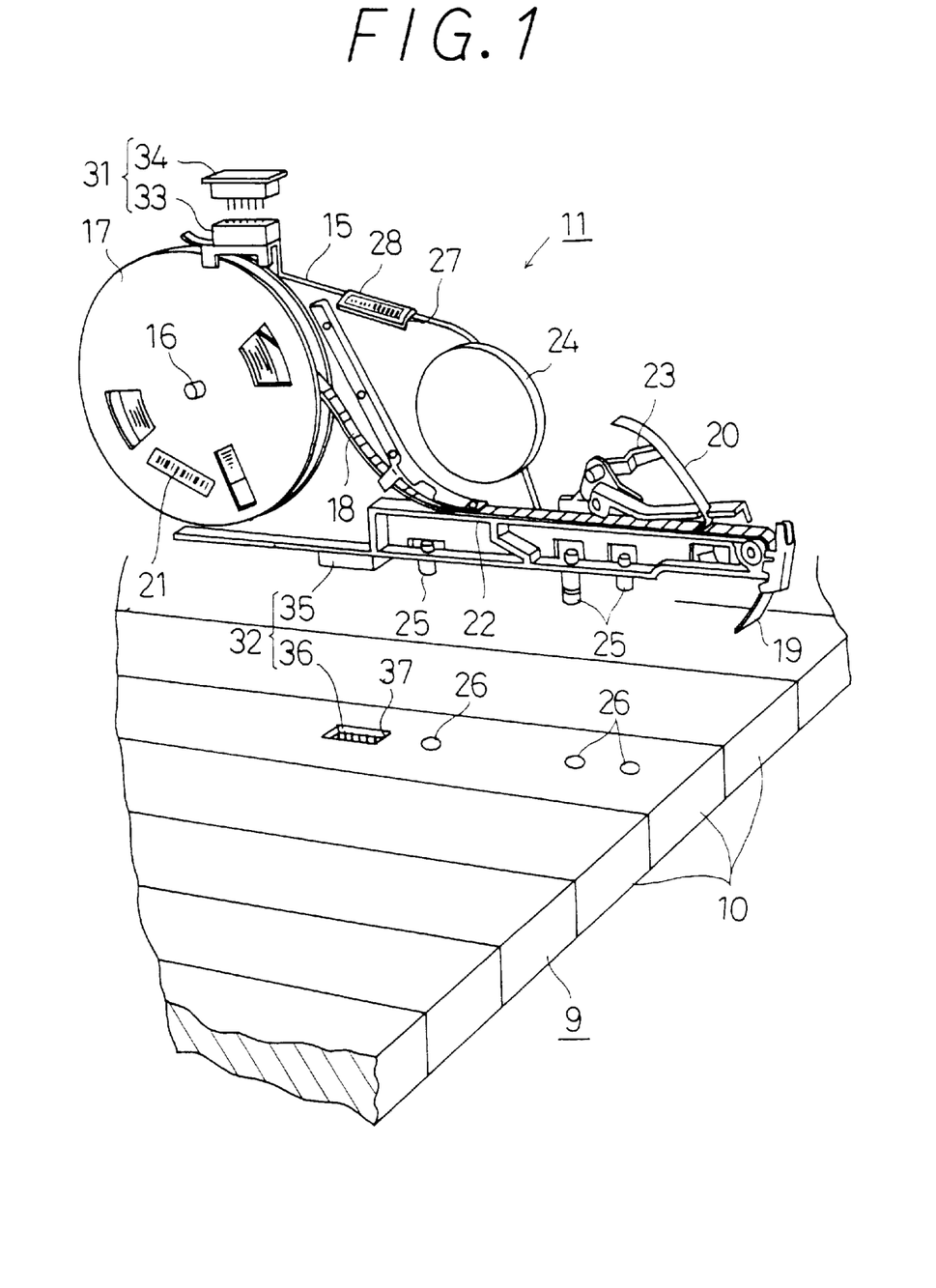
FIG. 1 is a perspective view showing the structure of the cartridge and the cartridge mounting rack.
Figure 2:
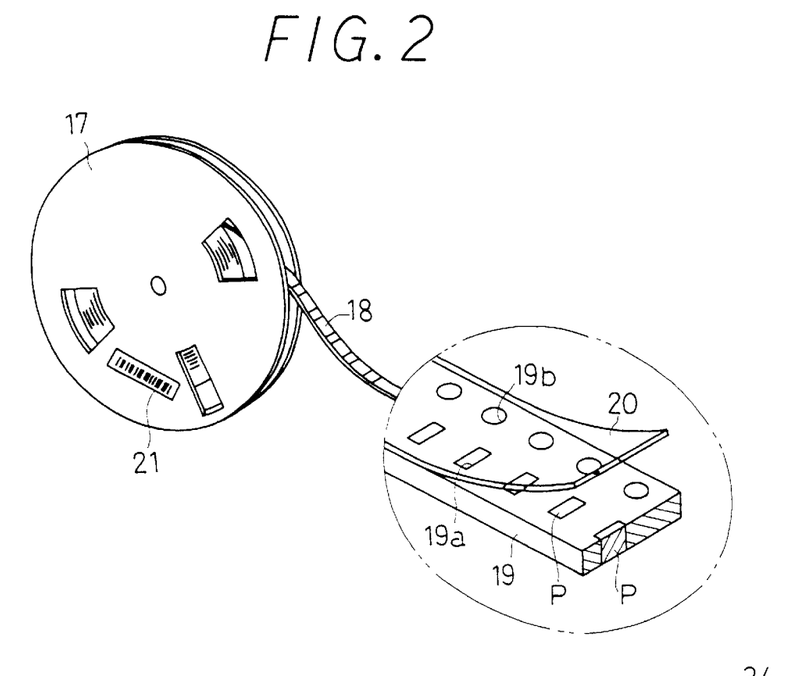
FIG. 2 is a perspective view showing the structure of the device reel and the tape.

Next, the structure of the cartridge 11 will be described in detail with reference to FIG. 1. Referring to FIG. 1, a device reel 17 (device storage member) is rotatably supported on a frame 15 of the cartridge 11 by a supporting shaft 16. The device reel 17 has a tape 18 wound around thereon, in which the devices are embedded at a predetermined pitch. FIG. 2 shows the detail thereof.

Referring to FIG. 2, the tape 18 includes a body tape 19 in which devices (e.g., chip condensers) P are embedded and a top tape 20 bonded to the surface of the body tape 19. Square holes 19a for embedding the devices P at the same pitch and round holes 19b made at the same pitch as the square holes 19a are formed in the body tape 19. The top tape 20 is realized in the form of transparent thin film and is easily separable from the body tape 19. If the top tape 20 is peeled from the body tape 19, the device P may be removed from the square hole 19a. A device reel label 21 on which a bar code corresponding to a reel number or type of the device such as a device number is printed is attached to the side of the device reel 17.

Referring to FIG. 1, a rail portion 22 for guiding the tape 18 is disposed on the frame 15 and the tape 18 guided on the rail portion 22 is divided into the body tape 19 and the top tape 20 at the end of the rail portion 22. At this time, the round hole 19b formed on the body tape 19 engages with a protrusion (not shown) on the rail portion 22, so that the tape 18 is fed by a pitch by a single feeding action of a feeding lever.

After the body tape 19 and the top tape 20 are separated from each other, the top tape 20 is fed upward as viewed in FIG. 1 and wound around a winding reel 24. The body tape 19 is fed downward as viewed in the same Figure. After that, the device P embedded in the square hole 19a is handed over to the suction nozzle 8 of the mounting head 7.

Protrusions 25 are disposed on the bottom of the frame 15. By inserting these protrusions 25 into positioning holes 26 in the lane 10, the cartridge 11 is positioned relative to the lane 10.

Figures 3, 4:
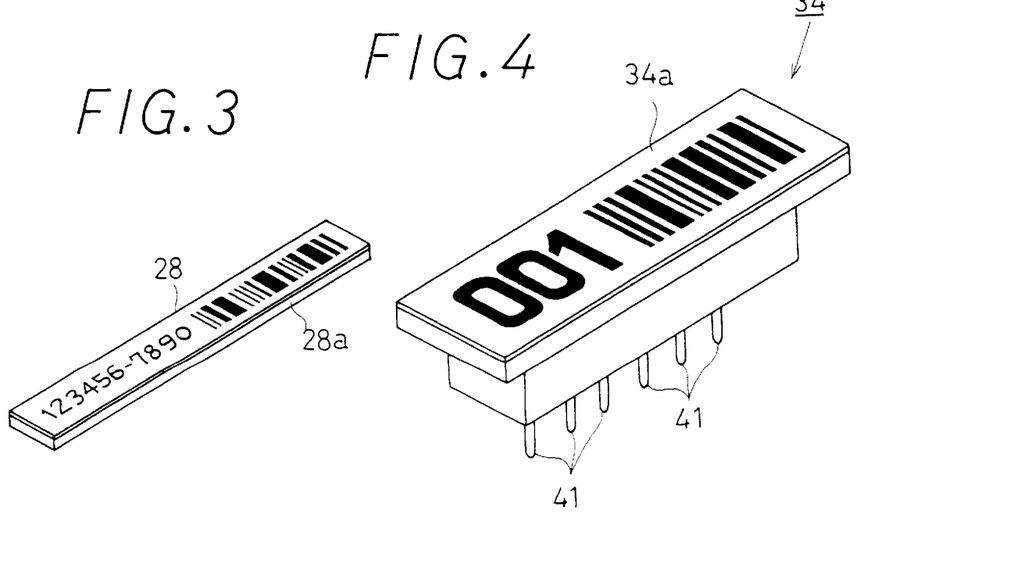
FIG. 3 is a perspective view showing the device number label.
FIG. 4 is a perspective view showing the connection plug.

A stay 27 made of magnetic metal is disposed on the top of the frame 15. A device number label 28 is removably attached to the stay 27. FIG. 3 schematically shows the device number label 28. Referring to FIG. 3, a magnetic sheet 28a is bonded to the rear side of the device number label 28. A device number and a bar code corresponding to the same device number are printed on the surface of the device number label 28.

On the other hand, the device supplying section 2 of the present embodiment includes an error detecting circuit (check means) for verifying whether the cartridge 11 is installed on a lanes 10 of a number previously set. That is, referring to FIG. 1, a first connector portion 31 and a second connector portion 32 are disposed as part of the same error detecting circuit. The first connector portion 31 includes an upper electrode portion 33 and a connection plug (area selection member) 34, which are a pair consisting of female and male parts. The upper electrode portion 33 is fixed on the top of the frame 15. The connection plug 34 is a single part which is attachable to the upper electrode portion 33. The second connector portion 32 includes a lower electrode portion 35 and a fixed plug 36 which are a pair consisting of female and male parts. The lower electrode portion 35 is fixed to the bottom of the frame 15 and the fixed plug 36 is fixed to a recess portion 7 provided in the lane 10. The upper electrode portion 33 and the lower electrode portion 35 are always electrically connected with each other. According to the present embodiment, the upper electrode portion 33, the connection plug 34 and the lower electrode portion 35 correspond to the cartridge side connector and the fixed plug 36 corresponds to the lane side connector.

Figure 5:
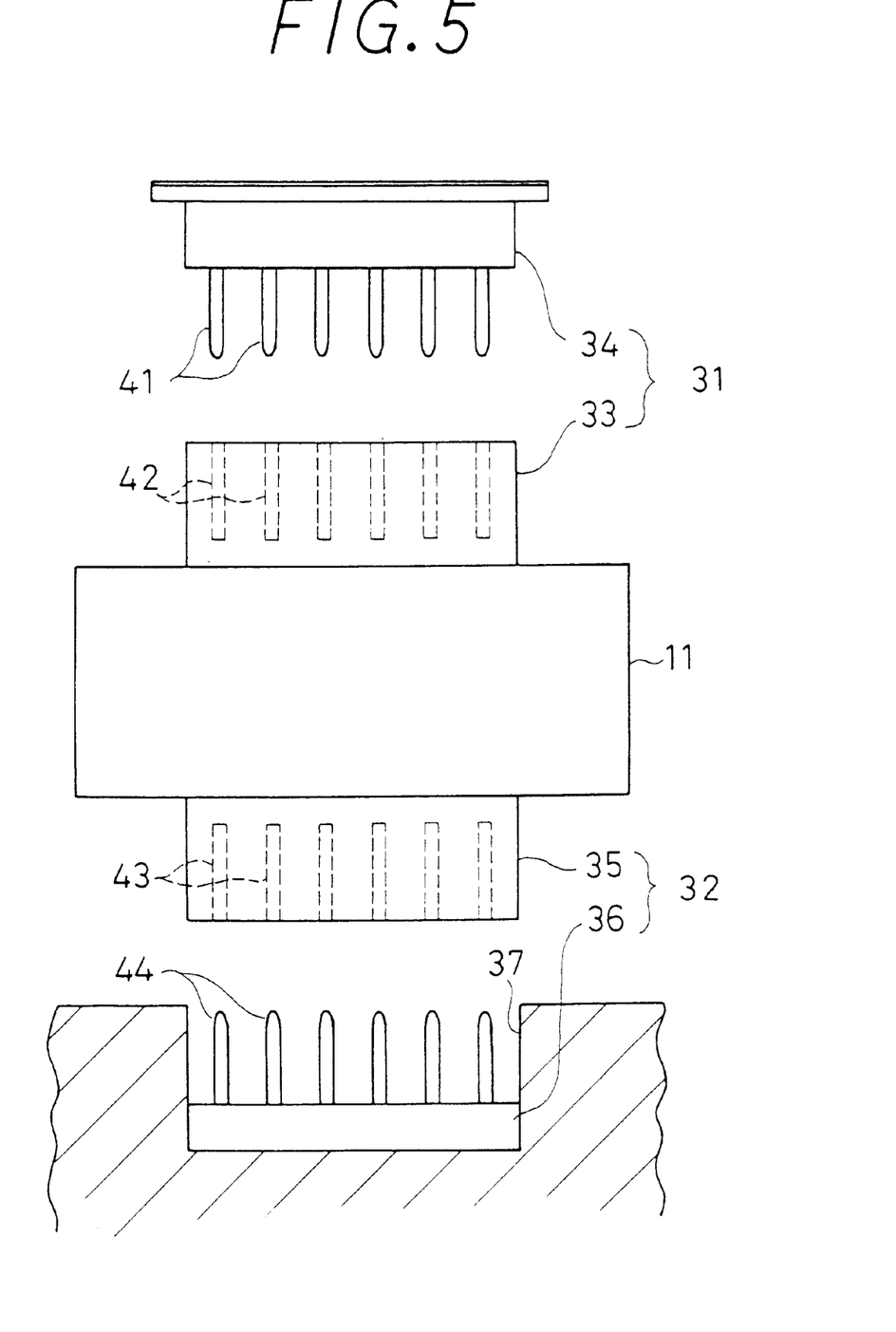
FIG. 5 is a construction diagram showing schematically the first and second connector portions.
Figure 6:
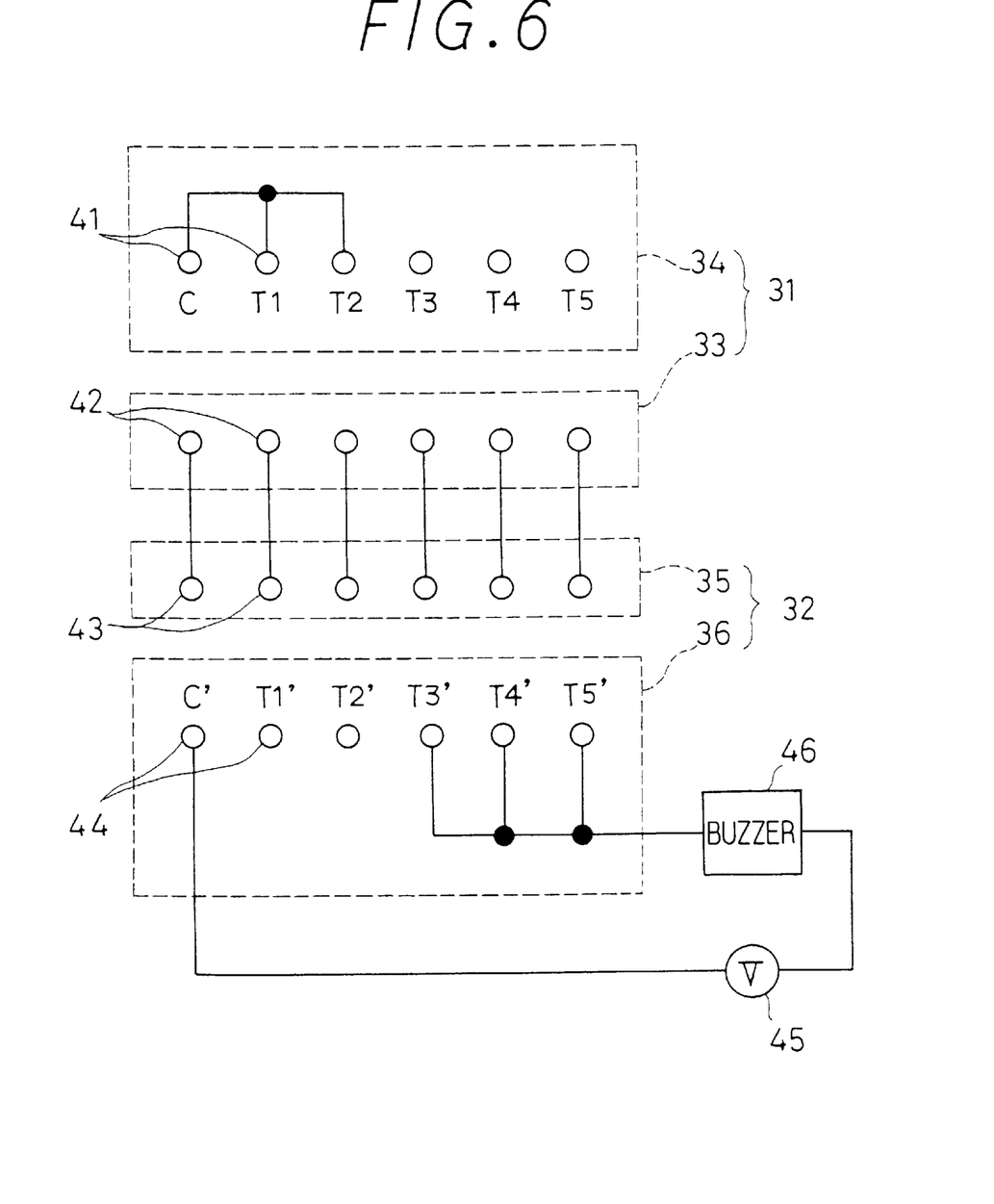
FIG. 6 is an electric circuit diagram showing schematically the first and second connector portions.
Figure 7:
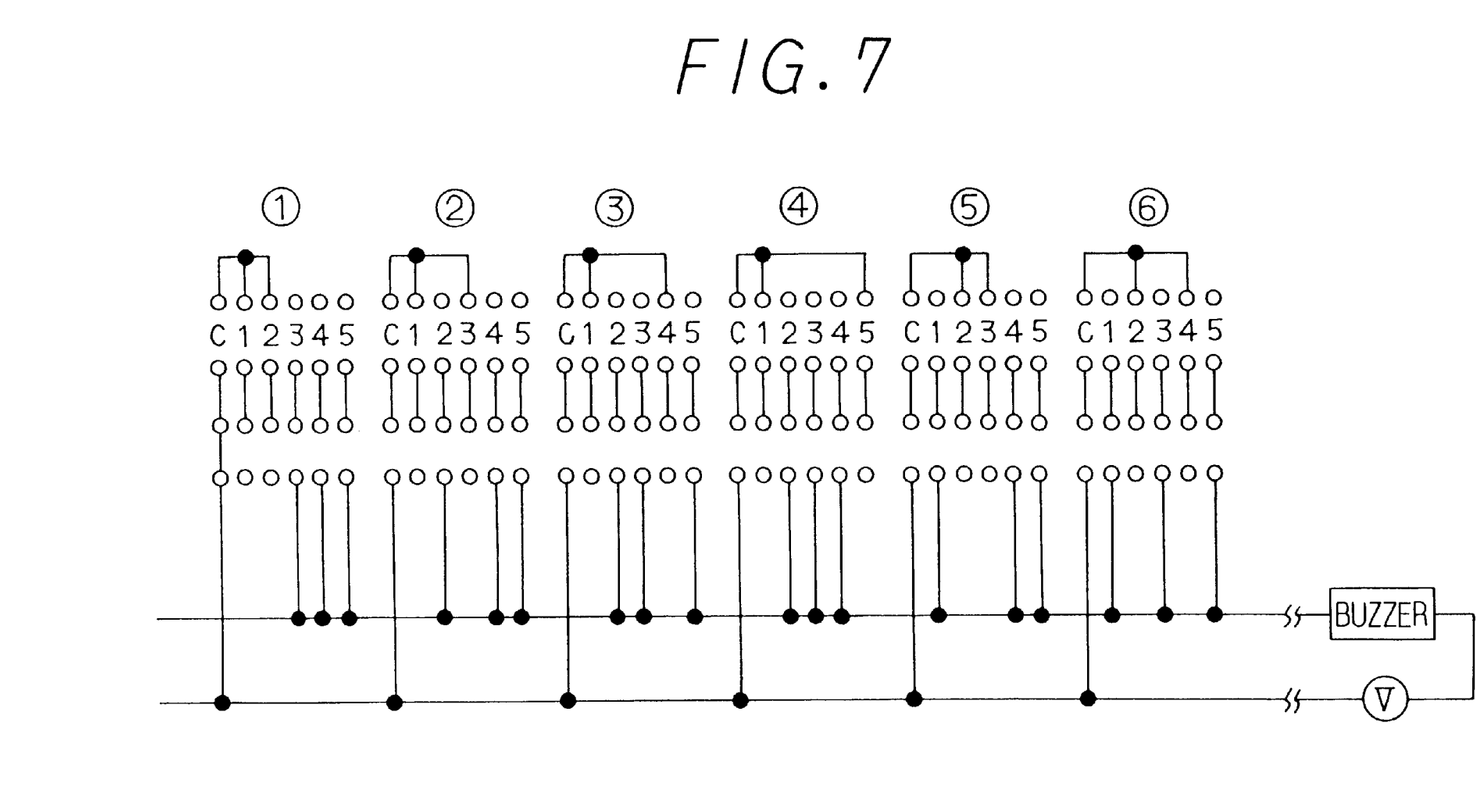
FIG. 7 is a circuit diagram showing the error detecting circuit.

Hereinafter, the construction of the above-mentioned error detecting circuit will be described in detail with reference to FIGS. 4–8. FIG. 4 is an enlarged view of the connection plug 34 of the first connector portion 31. FIG. 5 is a schematic view showing the connection of the first and second connector portions 31, 32. FIG. 6 is an electric circuit diagram of the error detecting circuit for the first lane. FIG. 7 is a diagram showing the connection pattern between the lane number and the pin number of the pin to be correspondingly connected. TABLE I below shows the relationship between the lane number and the connection pattern, where "X" indicates a short between pins.

TABLE I

| Lane Number | Selection Pin Number | | | | |
| --- | --- | --- | --- | --- | --- |
|  | T1 | T2 | T3 | T4 | T5 |
| 1 | X | X | | | |
| 2 | X | | X | | |
| 3 | X | | | X | |
| 4 | X | | | | X |
| 5 | | X | X | | |
| 6 | | X | | X | |
| 7 | | X | | | X |
| 8 | | | X | X | |
| 9 | | | X | | X |
| 10 | | | | X | X |
| 11 | X | X | | | |
| 12 | X | | X | | |

Referring to FIG. 4, a lane number label 34a (area number identification means) is attached to the surface (top as viewed in FIG. 4) of the connection plug 34. The same label 34a has the number of a lane "001" on which the cartridge 11 is to be mounted and a bar code corresponding to that lane number, both printed thereon.

In the first connector portion 31 shown in FIG. 5, the connection on plug 34 has six pin terminals 41 and the upper electrode portion 33 has pin holes in which the above-mentioned pin terminals 41 are to be inserted. On the other hand, in the second connector portion 32, the fixed plug 36 also has six pin terminals 44 and the lower electrode portion 35 has pin holes 43 in which the above-mentioned pin terminals 44 are to be inserted.

In this state, the pin terminals and pin holes of each plug and electrode portion are arranged in a predetermined order as shown in the Figure. When the connector portions 31, 32 are built up respectively, mating pin terminals and pin holes which are always the same combination are electrically connected with each other. Meanwhile, it is permissible to provide the respective members with, for example, a key and a key groove, in order to prevent the arrangement of the pin terminals and the pin holes from being reversed.

On the other hand, FIG. 6 is a circuit diagram showing the schematic view of FIG. 5 in the form of an electric circuit. This Figure shows the pin terminals and pin holes of the respective plug and electrodes 33–36 disposed in a lateral row, which correspond to the arrangement shown in FIG. 5. Here, the leftmost pin terminal of the connection plug 34 is a power terminal (hereinafter referred to as common pin C). The other pin terminals (hereinafter referred to as selection pins T1–T5) are terminals to be selectively connected to the common pin C. In FIG. 6, as the connection pattern corresponding to the first lane, the selection pins T1, T2 are connected to the common pin C. Additionally, the pin holes 42 of the upper electrode portion 33 and the pin holes 43 of the lower electrode portion 35 are always electrically connected to each other in one-to-one relationship.

In the fixed plug 36 as well, the leftmost pin terminal is a power terminal (hereinafter referred to as common pin C') like in the above mentioned connection plug 34. The other pin terminals are terminals hereinafter referred to as selection pins T1'–T5') selectively connected to the common pin C' through a power supply 45 and a warning buzzer (indicator) 46. In FIG. 6, as a connection pattern corresponding to the first lane, the selection pins T3'–T5' are connected to the common pin C' through the power supply 45 and the warning buzzer 46.

In this state, if the first and second connector portions 31, 32 are connected as shown in FIG. 6, this error detecting circuit is in a non-conductive state, so that the warning buzzer 46 is not actuated. In the present embodiment, the state shown in FIG. 6 is called "normal connection state". If the connection plug 34 has no connection pattern corresponding to the first lane (for example, when the selection pins T1, T3 are connected to the common pin C), when the connector portions 31, 32 are connected, the error detecting circuit is in a conductive state, so that the warning buzzer 46 generates a warning sound. In this case, operators judge there is a mounting error. Instead of the above mentioned warning buzzer 46, it is permissible to employ any means such as a warning lamp if it is a means for notifying the operators of an error warning.

Although FIG. 6 shows the connection pattern of the error detecting circuit of the first lane, the lanes 10 of the other numbers have a connection pattern corresponding to each lane number respectively. TABLE I shows an example of the connection patterns of the connection plug 34. If two selection pins are selectively connected to the common pin C in TABLE I, 10 combinations can be considered. In the fixed plug 36, the selection pins having pin numbers different from the pin numbers shown in TABLE I are connected to the common pin C' through the power supply 45 and the warning buzzer 46 to determine a connection pattern (a connection pattern making the error detecting circuit in non-conductive state as shown in FIG. 6).

FIG. 7 is an electric circuit diagram showing the composition of the error detecting circuit for the first lane through the sixth lane (represented by (1)–(6) in the same Figure). In FIG. 7, the connection plug 34 is connected according to the relationship shown in TABLE I. Additionally, on the lane side (fixed plug 36) as well, the fixed plug 36 is wired so that when it is in a normal state, a non-conductive state is attained. If a cartridge 11 which should be installed on the first lane is installed on the second lane, the error detecting circuit is in a conductive state, so that the warning buzzer makes a warning sound. As stated above, according to this error detecting circuit, it is possible to detect an installation error (setup error) of the cartridge 11 only by connecting the first and second connector portions 31, 32.

Because there are ten connection patterns identifiable according to this embodiment, the wiring in the connection plug 34 of the first lane coincides with the wiring in the connection plug 34 of the eleventh lane (see TABLE I). However, the possibility of failing to detect an error is lowered by visually confirming the lane number (see FIG. 4) printed on the top of the connection plug 34 or painting different colors on the top of the connection plugs 34 respectively.

Figure 10:
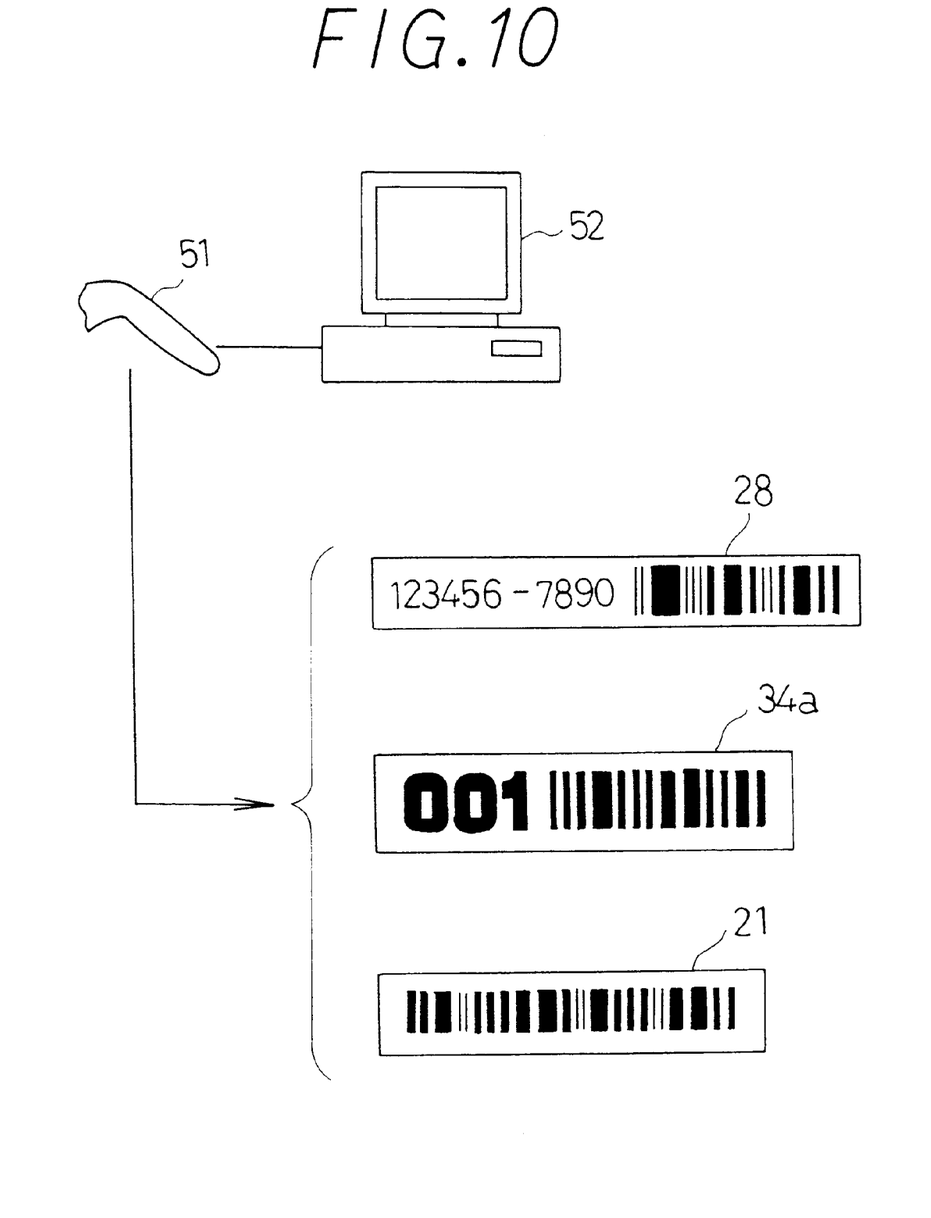
FIG. 10 is a schematic view showing the error detecting system by bar code.

FIG. 10 shows a schematic diagram of a system (setting part confirmation system) for determining whether or not normal setup is achieved according to bar code readout and a result of the readout. The bar code mentioned here is printed on each label as stated above. Explaining again, the device number label 28 is attached to the frame 15 (stay 27) of the cartridge 11 and that bar code has a "device number" printed thereon. The lane number label (area number identification means) 34a is attached to the top of the connection plug (area selection member). That bar code has a "lane number (area number)" printed thereon. The device reel label (device identification means) is attached to the device reel (device storage member) 17. That bar code has "a reel number, a device number representing the device type, and the like" printed thereon.

In this state, a bar code reader 51 reads out respective bar codes of the device number label 28, the lane number label 34a and the device reel label 21 and sends the result to a personal computer 52. Then, if the result of readout from the three bar codes coincides with a relation previously set up, the personal computer 52 determines that normal operation is attained. Otherwise, the personal computer 52 determines that abnormal operation is attained. Also, this procedure for determining whether normal or abnormal can be carried out only by collating the result of readout from each bar code on the lane number label 34a with the result of readout from each bar code on the device reel label 21. As a result, normal combination between a device and the connection plug 34 can be attained.

The setup procedure for the electronic device mounting apparatus having the above described construction will be described below.

First, the cartridge 11 is provided. The connection plug 34 corresponding to the number of a lane on which that cartridge should be installed is selected. At this time, selection of the connection plug 34 is performed according to TABLE I as mentioned previously. Then, the connection plug 34 is fitted to the upper electrode portion 33 of the cartridge 11. Then, the device reel 17 is mounted to the above mentioned cartridge 11.

The same cartridge 11 is installed on the lane 10 of a predetermined number. At this time, the lower electrode portion 35 of the cartridge 11 is electrically connected to the fixed plug 36 of the lane 10. If the installation position of the cartridge is appropriate, the warning buzzer 46 is not actuated.

(d) The bar codes of the device number label 28, the lane number label 34a and the device reel label 21 are read by the bar code reader 51. At this time, if results of the readout of three bar codes coincide with a previously set relation, it is determined that normal operation is attained. (meanwhile, it is not always necessary to read a bar code of the device number label 28.)

If an error is detected in (c) and/or (d), reinstallation of the cartridge 11 or replacement of the device reel 17 is conducted. As explained above, the setup procedures (a)–(d) are executed for every lane.

According to the electronic device mounting apparatus of the present embodiment described up to here, the following effects can be obtained. That is, the cartridge side connector (upper electrode portion 33, connection plug 34, lower electrode portion 35) and the lane side connector (fixed plug 36), both electrically connected when the cartridge 11 is disposed on the lane 10, are provided on the cartridge 11 and the lane 10 of the cartridge mounting rack 9, respectively, to form the error detecting circuit including these connectors as part thereof. The error detecting circuit determines whether or not the installation position of the cartridge 11 is normal depending on the conductive state or non-conductive state from the power supply 45 to the warning buzzer 46 when each of these connectors is connected.

Due to this construction, the cartridge 11 is installed in the lanes 10 with the upper electrode portion 33 and the connection plug 34 connected to each other. When the cartridge is installed, the lower electrode portion 35 is electrically connected to the fixed plug 36. At this time, if the installation position is normal, the warning buzzer 46 is not brought into the conductive state, so that the buzzer 46 is not actuated. However, if the installation position is wrong, the warning buzzer 46 is brought into the conductive state, so that the buzzer 46 makes a warning sound. In this case, operation of installing the cartridge 11 to the lanes 10 leads to operation of detecting an error. That is, as soon as the cartridge 11 is installed, whether or not there is an error is determined and result of that determination is reported to an operator. Thus, it is possible to improve the efficiency of the setup procedure. The above-described construction makes it possible to realize prevention of an error at the setup stage, thereby leading to mounting proper devices without any mistake.

Particularly under the present embodiment, the cartridge side connector (connection plug 34) and the lane side connector (fixed plug 36) contain six pins 41, 44 each respectively arranged in a predetermined order and one terminal of each six pins is specified as a power terminal (common pins C, C'). The common terminals C, C' are selectively connected to the other specific terminals (selection pins T1–T5, T1'–T5') to set a plurality of connection patterns corresponding to the cartridge 11 or the identification number (lane number) of the lanes 10 (see FIG. 7 and TABLE I). The error detecting circuit is constructed to determine whether the installation position of the cartridge 11 is normal depending on the conductive state or non-conductive state in conformity with the above mentioned connection pattern (the non-conductive state indicates normal according to the present embodiment). As a result, the construction of the error detecting circuit can be simplified.

On the other hand, the lane number label 34a (first bar code indicating portion) for indicating the installation position (lane number) of the cartridge 11 by bar code is disposed on the cartridge 11 (connection plug 34). The device reel label 21 for indicating a device P (electronic device) supplied from the cartridge 11 by bar code is disposed thereon. Then, the bar codes of both the labels 34a, 21 are verified by means of the bar code reader 51 and the personal computer 52 to determine whether or not combination of the device P with the number of the lane to which the device P should be supplied is wrong.

In this case, it is possible to achieve judgment on whether or not the cartridge 11 has been installed to a desired lane 10 without only depending upon visual confirmation by the operator, by bar code retrieval realized by the above-described construction.

Particularly, according to the present embodiment, because the lane number label 34a is provided on the connection plug 34 to be mounted on the cartridge 11 as described above, inherent information (connection pattern) on the connection plug 34 and inherent information (bar code) on the lane number label 34a always coincide with each other as information on the lane number. Thus, it is possible to confirm proper arrangement easily and securely. Further, since inherent information on the connection plug 34 and inherent information on the lane number label 34a are provided in an integrated fashion, information control of the connection plug 34 is facilitated.

According to the above described embodiment, although the connection pattern of the connection plug 34 and the connection pattern of the fixed plug 36 are determined for each lane number to form the error detecting circuit, existing parts are used as the cartridge 11 and other devices of the electronic device mounting apparatus. The device number label 28 is freely detachable by use of the magnetic sheet 28a. Thus, an effect depending on the present embodiment can be obtained without changing the construction of the apparatus. In this case, the error detecting circuit and bar code detecting means according to the present embodiment can be applied to not only the type explained in the above embodiment, but also existing various types of cartridges.

Meanwhile, the present invention may be realized in the following embodiments as well as the above described embodiment. (1) According to the above embodiment, although the connection plug 34 has six pins, of which one is a common pin and the other five pins are selection pins, this pin number may be changed. For example, in a case that the number of the selection pins is 6 (total number of pins=7) and the lane number is identified by combination of the common pin and two selection pins, 15 types of combinations are possible {(6×5)/2=15 types }.

Figure 11:
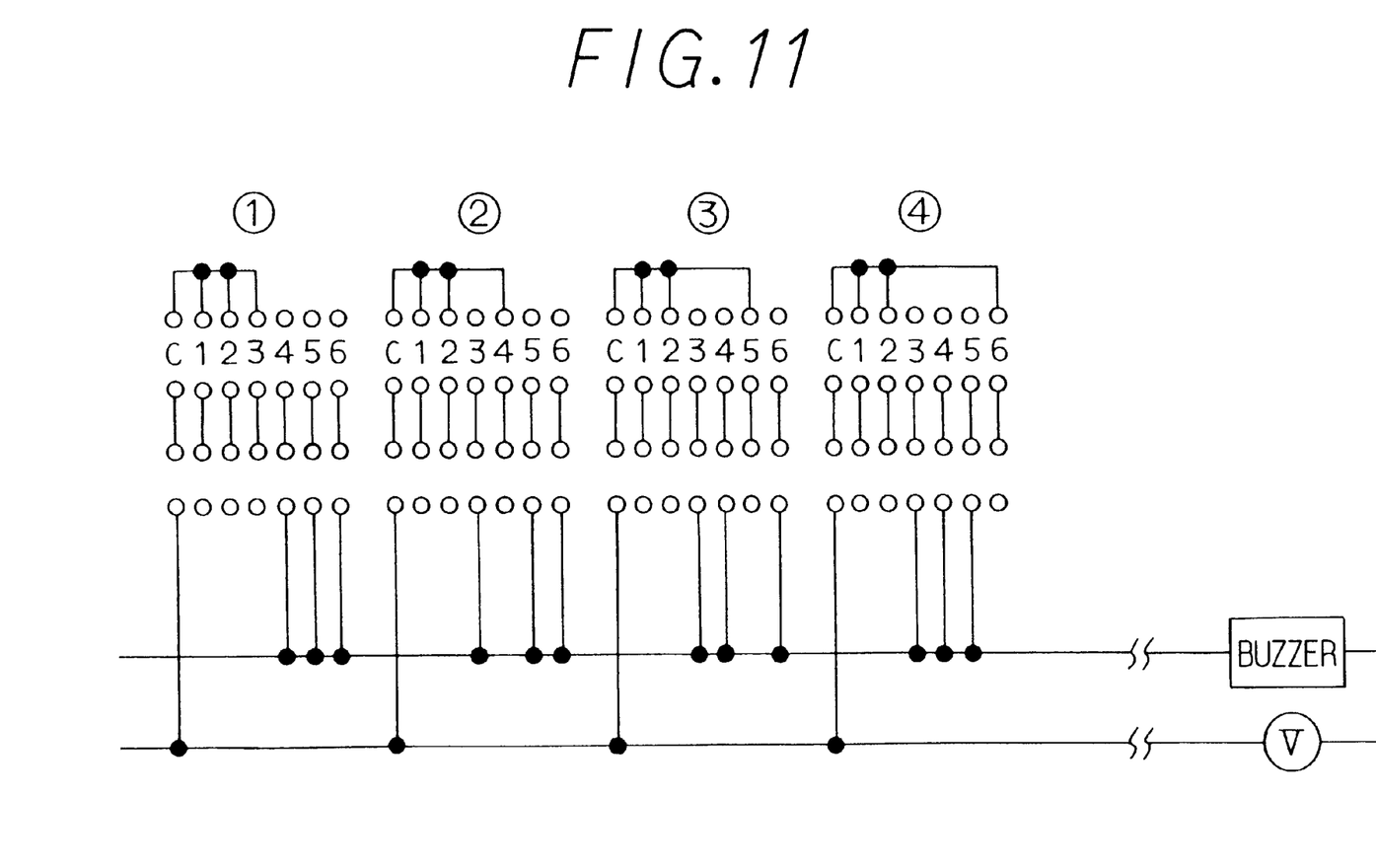
FIG. 11 is a circuit diagram showing the error detecting circuit according to another embodiment.

Further, in a case that identification of the lane number is conducted by combination of the common pin and three selection pins, 20 types of combinations are possible {(6× 5×4)/3×2=20 types}. TABLE II below shows those connection patterns. FIG. 11 is an electric circuit diagram showing the construction of the error detecting circuit from the first lane to the fourth lane (represented by (1)–(4) in the same Figure) according to such a combination. If restraints in terms of cost due to an increase of the number of pins can be neglected, it is possible to increase the number of identifiable lanes by increasing the number of pins. At this time, the number of identifiable lanes can be increased without particularly increasing the complexity of the device structure.

TABLE II

| Lane Number | Selection Pin Number | | | | | |
|---|---|---|---|---|---|---|
| | T1 | T2 | T3 | T4 | T5 | T6 |
| 1 | X | X | X | | | |
| 2 | X | X | | X | | |
| 3 | X | X | | | X | |
| 4 | X | X | | | | X |
| 5 | X | | X | X | | |
| 6 | X | | X | | X | |
| 7 | X | | X | | | X |
| 8 | X | | | X | X | |
| 9 | X | | | X | | X |

TABLE II-continued

| Lane Number | T1 | T2 | T3 | T4 | T5 | T6 |
|---|---|---|---|---|---|---|
| 10 | X |   |   |   | X | X |
| 11 |   | X | X | X |   |   |
| 12 |   | X | X |   | X |   |
| 13 |   | X | X |   |   | X |
| 14 |   | X |   | X | X |   |
| 15 |   | X |   | X |   | X |
| 16 |   | X |   |   | X | X |
| 17 |   |   | X | X | X |   |
| 18 |   |   | X | X |   | X |
| 19 |   |   | X |   | X | X |
| 20 |   |   |   | X | X | X |

(2) According to the above described embodiment, although the connection pattern of each connector portion is set so that the non-conductive state of the warning buzzer is "normal", conversely, it is permissible to set the wiring pattern so that the conductive state is "normal".

(3) According to the above embodiment, although the pin terminals or the pin holes of the first and second connector portions 31, 32 are arranged in a lateral row, any arrangement, for example, in plural rows, is permissible.

Figure 12:
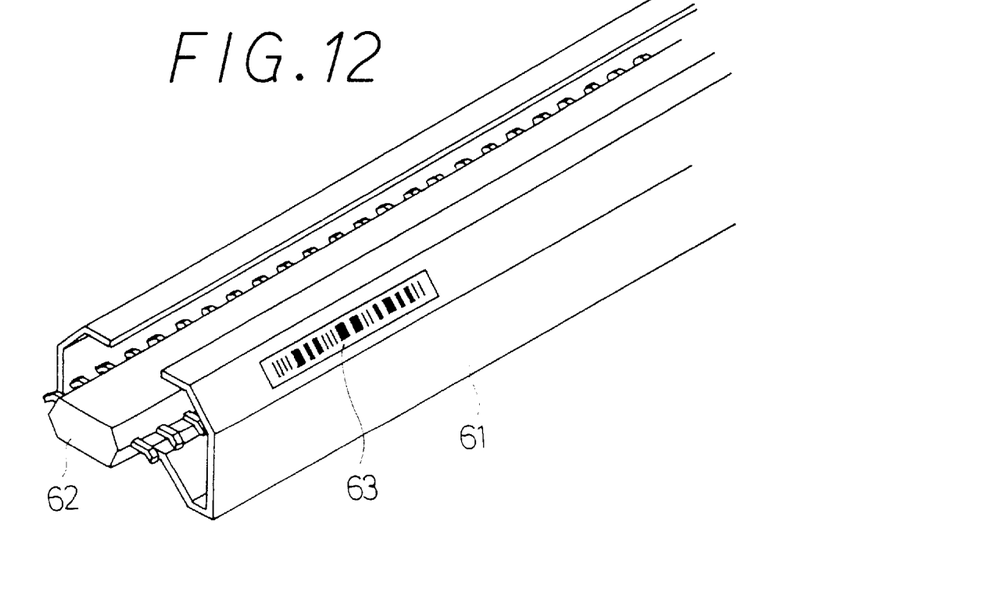
FIG. 12 is a perspective view showing a device supplying part formed in the shape of a stick.

(4) According to the above embodiment, although the devices are supplied by the device reel 17, this may be changed. For example, FIG. 12 shows a device supplying part constructed in the shape of a stick. In this case, the devices 62 arranged linearly are incorporated in a device case 61. A device case label 63 on which the bar code corresponding to its case number or the kind of the device such as a part number is printed is attached to the device case 61. Meantime, the device case 61 is also contained in the device storage member.

(5) According to the above embodiment, although the connection plug 34 (cartridge side connector) is connected to the fixed plug 36 (lane side connector) through the electrode portions 33, 34, it is permissible to connect the above both plugs 34, 36 directly with each other by omitting the electrode portions 33, 34.

(6) According to the above embodiment, although detection of a setup error by the error detecting circuit and detection of a setup error by bar code retrieval are combined to implement the present invention, it is permissible to form a setup error detecting system for implementing either error detection individually. For example, in the above embodiment, it is permissible to omit the bar code retrieval in order to detect a setup error only by the error detecting circuit, or in the above embodiment, it is permissible to omit detection of a setup error by the error detecting circuit in order to detect a setup error only by the bar code retrieval.

Although the present invention has been fully described in connection with the preferred embodiment thereof with reference to the accompanying drawings, it is to be noted that various changes and modifications will become apparent to those skilled in the art. Such changes and modifications are to be understood as being included within the scope of the present invention as defined by the appended claims.

What is claimed is:

1. A device mounting confirmation system comprising:

a plurality of device storage members each including device identification means for identifying a type of device stored in each of the respective plurality of device storage members;

a plurality of common use cartridges each having a first connect portion and a second connect portion electrically connected with each other, wherein each of the plurality of common use cartridges is removably attachable to any of the plurality of device storage members;

a cartridge mounting station having a plurality of setting areas to which any of the plurality of common use cartridges may be connected, respectively, wherein each of the plurality of setting areas has a respective third connect portion that is electrically connectable with any of the first connect portions when a respective one of the plurality of common use cartridges is connected to a respective one of the plurality of setting areas;

a plurality of area selection members each having a fourth connect portion electrically connectable with any of the second connect portions;

area number identification means provided on each of the plurality of area selection members, respectively, for identifying each respective one of the plurality of setting areas; and error detecting means for detecting an incorrect installation among each of the plurality of common use cartridges, each of the plurality of setting areas, and each of the plurality of area selection members by determining if actual electrical connection states between the first and third connect portions, and between the second and fourth connect portions, correspond to preset electrical connection states.

2. The device mounting confirmation system of claim 1 further comprising a device number label disposed on each of the plurality of common use cartridges, the device number label having information associated with the device identification means.

3. The device mounting confirmation system of claim 1 further comprising a warning means for generating a warning when the error detecting means determines the incorrect installation.

4. The device mounting confirmation system of claim 1, wherein the device identification means is a bar code, and the area number identification means is a bar code, and further comprising a determining means for determining whether a combination of a device stored in one of the plurality of device storage members, and one of the plurality of area selection members satisfies predetermined criteria by comparing a readout result of each of the bar codes to a previously set relationship.

* * * * *